(12) United States Patent
Le

(10) Patent No.: US 6,476,650 B2
(45) Date of Patent: Nov. 5, 2002

(54) METHOD FOR OUTPUTTING DATA AND CIRCUIT CONFIGURATION WITH DRIVER CIRCUIT

(75) Inventor: Thoai-Thai Le, Cary, NC (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/005,944

(22) Filed: Dec. 3, 2001

(65) Prior Publication Data

US 2002/0084810 A1 Jul. 4, 2002

(30) Foreign Application Priority Data

Dec. 1, 2000 (DE) .......................................... 100 59 740

(51) Int. Cl.[7] .............................. H03B 1/00; H03K 3/00
(52) U.S. Cl. ........................................ 327/108; 327/112
(58) Field of Search ................................ 327/108, 109, 327/112, 261, 264, 269, 271, 285; 326/82–87

(56) References Cited

U.S. PATENT DOCUMENTS

| | | | |
|---|---|---|---|
| 5,568,081 A | 10/1996 | Lui et al. ..................... 327/380 |
| 5,959,474 A | * 9/1999 | Park et al. .................... 326/83 |
| 5,963,047 A | 10/1999 | Kwong et al. ................ 326/27 |
| 6,094,086 A | * 7/2000 | Chow ............................ 326/27 |
| 6,225,824 B1 | * 5/2001 | Madhu et al. ................ 326/27 |
| 6,255,867 B1 | * 7/2001 | Chen ........................... 327/108 |
| 6,281,706 B1 | * 8/2001 | Wert et al. ................... 326/121 |

FOREIGN PATENT DOCUMENTS

EP 0 586 207 A1 3/1994

* cited by examiner

*Primary Examiner*—My-Trang Nu Ton
(74) *Attorney, Agent, or Firm*—Laurence A. Greenberg; Werner H. Stemer; Gregory L. Mayback

(57) ABSTRACT

A method and also a circuit configuration with a driver circuit for the parallel amplification of two input signals is described. A first and a second amplified output signal respectively are formed from the input signals, in which case, in the event of a change in the amplitudes of the two input signals in a predetermined time period, the first output signal is changed with a first temporal gradient in a first time period and is then changed with a second gradient in a second time period, and in which case the second output signal is changed with a third temporal gradient in a third time period and is then changed with a fourth temporal gradient in a fourth time period.

19 Claims, 4 Drawing Sheets

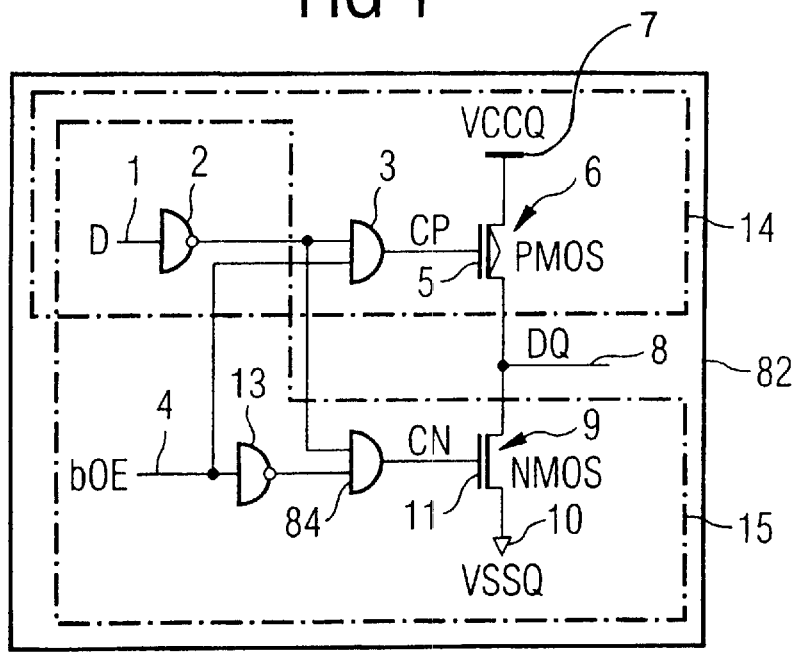
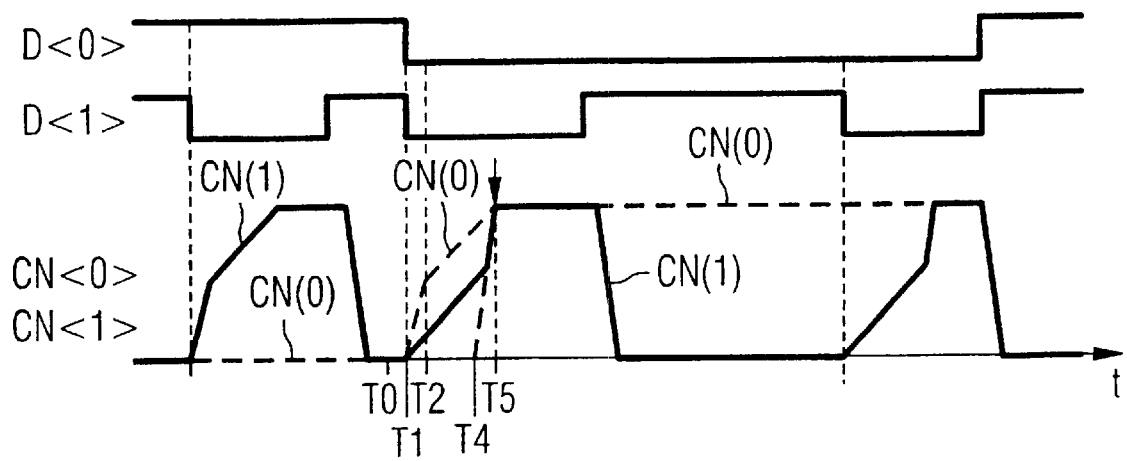

METHOD FOR OUTPUTTING DATA AND CIRCUIT CONFIGURATION WITH DRIVER CIRCUIT

BACKGROUND OF THE INVENTION

1. Field of the Invention

The invention relates to a method for outputting data and a circuit configuration with a driver circuit for outputting the data. More specifically, two input signals are amplified in parallel for generating the output data.

Integrated circuits such as processors and semiconductor memories have output drivers (off-chip drivers (OCD)) in order to amplify and output signals that are stored in memory cells of the memory. The output drivers used have a high driver capability in order to be able to generate an output signal that can be identified unambiguously even in the case of a high load. The high driver capability and the associated large temporal gradient of the current change at the output of the output drivers have the disadvantage that high interference voltages are generated in the event of a change in the amplitude of the output signal. When there is a multiplicity of output drivers, a large current flow is generated, with the result that the internal voltage supply is subjected to severe fluctuations. In particular, there is the risk of the ground potential being raised as far as the region of the switching threshold of transistors. This can result in erroneous behavior and the loss of switching states.

U.S. Pat. No. 5,963,047 discloses a CMOS output buffer circuit that suppresses noise signals on adjacent input pins. Each output buffer has a weak and a strong pull-down transistor. The strong pull-down transistor is switched off during a switching time in which reflections occur. Furthermore, a turn-off device is provided, which inhibits the strong pull-down transistors of adjacent input pins when reflections of an output buffer occur.

Published, European Patent Application EP 0 586 207 A1 discloses a circuit configuration for an output driver which has a plurality of output lines. On the various output lines, the signals are changed over in a manner dependent on the instant of the change from a low state to a high state or from a high state to a low state with gradients of different magnitudes. In this case, only a single gradient is used for a respective output signal of an output line. What is achieved in this way is that all the outputs are at the changed-over high or low state up to a predetermined instant.

U.S. Pat. No. 5,568,081 discloses a control device for an output buffer that can adjust the temporal gradient of an output signal. The temporal gradient of the output signal is varied in a manner dependent on the temporal gradient of the current of the output signal. The setting of the temporal gradient of the output signal is chosen to be small in the case of a large temporal gradient of the current and large in the case of a small temporal gradient of the current.

SUMMARY OF THE INVENTION

It is accordingly an object of the invention to provide a method for outputting data and a circuit configuration with a driver circuit that overcomes the above-mentioned disadvantages of the prior art methods and devices of this general type, with which interference voltages are reduced.

With the foregoing and other objects in view there is provided, in accordance with the invention, a method for the parallel amplification of two input signals including a first input signal and a second input signal, a first amplified output signal being formed from the first input signal and a second amplified output signal being formed from the second input signal. The method includes performing the following steps in an event of a change in amplitudes of the two input signals in a predetermined time period: changing the first amplified output signal with a first temporal gradient during a first time period; changing the first amplified output signal with a second temporal gradient during a second time period, the first temporal gradient being larger than the second temporal gradient; changing the second amplified output signal with a third temporal gradient during a third time period; and changing the second amplified output signal with a fourth temporal gradient during a fourth time period, the fourth temporal gradient being larger than the third temporal gradient.

One advantage of the invention is that, in the event of a virtually simultaneous change in the input signal, output signals are changed with different temporal gradients in a first and second and, respectively, third and fourth time period. In this way, the gradients of the output signals can be coordinated with one another, with the result that only a small interference voltage is output.

Preferably, the change of the first and second output signals is begun simultaneously. An exceptional reduction of the interference voltage that is output is achieved by virtue of the fact that the temporal gradients of the two output signals do not simultaneously have a maximum gradient. Therefore, overall, a smaller interference voltage is output by the two output signals.

In a preferred embodiment, the first and second and, respectively, the third and fourth time periods and the corresponding temporal gradients of the first and second output signals are chosen such that the first and second output signals simultaneously reach a maximum high level and a minimum low level, respectively.

The method is preferably used for reading out information stored in memory cells of a memory, in particular of a semiconductor memory.

With the foregoing and other objects in view there is provided, in accordance with the invention, a circuit configuration. The circuit contains two driver circuits, including a first driver circuit and a second driver circuit, for a parallel read-out of signals. Each of the two driver circuits has an input for receiving one of two input signals and an output. An adapting circuit is connected to the input of each of the two driver circuits, and in that, in an event of a change of amplitudes of the two input signals in a predetermined time period, the adapting circuit changes a first output signal with a first temporal gradient in a first time period and then changes the first output signal with a second temporal gradient being smaller than the first temporal gradient in a second time period. The adapting circuit also changes a second output signal with a third temporal gradient in a third time period and then changes the second output signal with a fourth temporal gradient in a fourth time period, the fourth temporal gradient being larger than the third temporal gradient.

A preferred embodiment prescribes two driver circuits for the parallel reading out of signals, at least one driver circuit being connected to an adapting circuit. The adapting circuit is connected to the inputs of the first and second driver circuits. In the event of a simultaneous change in the input signal to a new potential state, the adapting circuit changes an output signal with a first temporal gradient in a first time period and then with a second temporal gradient in a second time period.

In a preferred embodiment, a second adapting circuit is only connected to the second data output, with the result that the adapting circuit changes the second output signal with a third temporal gradient in a third time period and then changes it with a fourth temporal gradient in a fourth time period.

Preferably, the adapting circuit has a first and a second path, via which a gate terminal of the output transistor can be connected to a switching potential. At least one switch is disposed in each path, the switch being connected to the first and second signal inputs via a delay circuit. On account of the delay circuit, the two switches are switched in a temporally staggered manner. In this way, the temporal gradient of the gate voltage at the gate terminal is prescribed such that it has different magnitudes in different time periods.

In a simple embodiment, a gate is disposed as the delay circuit. The switch is preferably a field-effect transistor.

A preferred embodiment of the first and second driver circuits consists in the configuration of a first and third and, respectively, a second and fourth output transistor. The first and third and, respectively, the second and fourth output transistors are preferably PMOS and, respectively, as NMOS field-effect transistors. The first and third and, respectively, the second and fourth output transistors are connected in series via a respective connecting line, a first and second signal output, respectively, being connected to the connecting line.

In accordance with an added feature of the invention, the first driver circuit has a first output circuit and the second driver circuit has a second output circuit.

In accordance with another feature of the invention, the first output circuit includes a connecting line, a first output transistor having a gate terminal, and a second output transistor having a gate terminal. The first and second output transistors are connected in series through the connecting line. The connecting line is connected to the output of the first driver circuit, and the gate terminal of the first and/or second output transistors is connected to the adapting circuit.

In accordance with an additional feature of the invention, the second output circuit has a connecting line, a first output transistor with a gate terminal, and a second output transistor with a gate terminal. The first and second output transistors are connected in series through the connecting line. The connecting line is connected to the output of the second driver circuit. The gate terminal of the first and/or second output transistors is connected to the adapting circuit.

In accordance with a further feature of the invention, the first output transistor is a PMOS transistor having an input and the second output transistor is an NMOS field-effect transistor, the input of the PMOS transistor is to be connected to a high voltage potential and the input of the NMOS field-effect transistor is to be connected to a low voltage potential.

In accordance with a further added feature of the invention, the adapting circuit connects the gate terminal of the first output transistor and/or the second output transistor to a predetermined potential via two paths. Two switches are provided with one of the switches disposed in each of the two paths. The two switches are coupled to the input of the first driver circuit through a delay circuit. The delay circuit is connected to the two switches and opens or closes the two switches in an event of a change of a state of the two input signals in the predetermined time period, including in an event of a simultaneous change, at different instants.]

Other features which are considered as characteristic for the invention are set forth in the appended claims.

Although the invention is illustrated and described herein as embodied in a method for outputting data and a circuit configuration with a driver circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of a driver circuit;

FIG. 3 is a signal-timing diagram of the driver circuit shown in FIG. 2;

DESCRIPTION OF THE PREFERRED EMBODIMENTS

Figure 2:
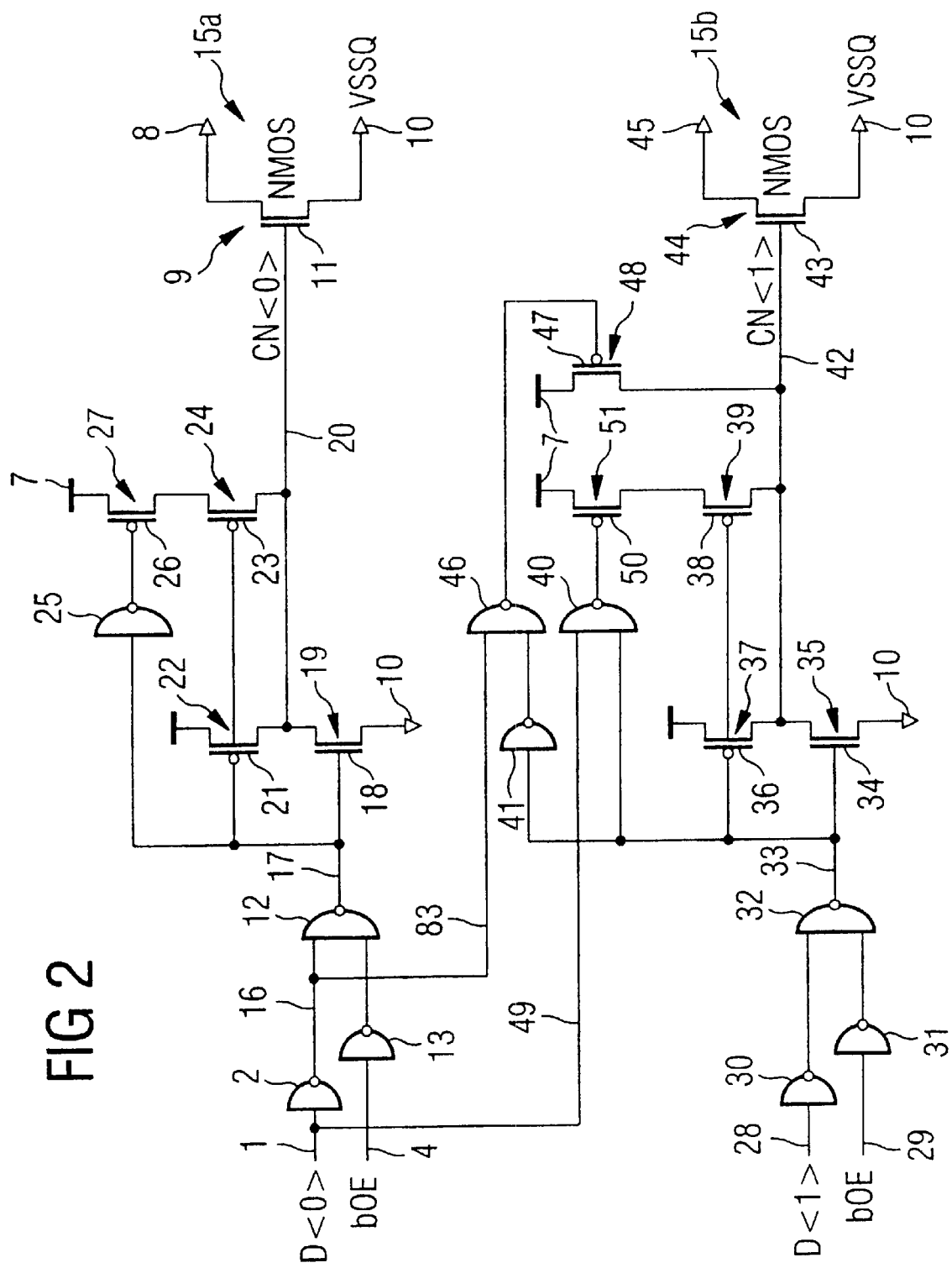
FIG. 2 is a circuit diagram of a detail of the driver circuit, two driver circuits being coupled to one another.

Referring now to the figures of the drawing in detail and first, particularly, to FIG. 1 thereof, there is shown the construction of a driver circuit which, for example, represents an output driver of a semiconductor memory 82. A memory cell of the semiconductor memory 82 is connected to a data input. 1 via a read-out logic unit. Information items are stored in the memory cell in the form of two states, a first state representing a 0 and a second state representing a 1. When the information is read from the memory cell, the two states are converted by the read-out logic unit into a signal which, depending on the state, has a high voltage level, a so-called high state, or a low voltage level, a so-called low state. Consequently, depending on the stored information, either a high state or a low state is present at the data input 1 when the information is read out. The data input 1 is connected to a first inverter 2. The first inverter 2 converts the supplied signal from a high state to a low state, and vice versa. An output of the first inverter 2 is connected to a first input of a first OR gate 3. A second input of the first OR gate 3 is connected to a control input 4. An enable signal bOE is fed in via the control input 4. The enable signal can have a high state or a low state. The enable signal is provided by a control circuit of the semiconductor memory, the control circuit not being illustrated.

An output of the first OR gate 3 is connected to a first gate terminal 5 of a first transistor 6. The first transistor 6 is a PMOS field-effect transistor and is connected to a supply voltage 7 by one input. An output of the first transistor 6 is connected to a signal output 8. The signal output 8 is additionally connected to an input of a second transistor 9. An output of the second transistor 9 is connected to ground 10. The supply voltage 7 provides a voltage with a high state and ground 10 provides a potential with a low state.

The second transistor 9 has a second gate terminal 11, which is connected to an output of a first AND gate 84. The second transistor 9 is an NMOS field-effect transistor.

The control input 4 is connected to an input of a second inverter 13. The second inverter 13 is connected by an output to a second input of the first AND gate 84. The output of the first inverter 2 is connected to a first input of the first AND gate 84.

The driver circuit of FIG. 1 is constructed in such a way that a high level present at the data input 1 is output in amplified form at the signal output 8 if, at the same time, the control input 4 is in a low state. In the event of a low state at the control input 4 and a low state at the data input 1, a high state is output at the signal output 8.

A semiconductor memory has a multiplicity of the driver circuits illustrated in FIG. 1, but not all the driver circuits are individually illustrated. The signal path via the data input 1, the first inverter 2, the first OR gate 3 and the first transistor 6 is designated as a first signal path 14. The signal path via the data input 1, the first inverter 2, the first AND gate 84 and the second transistor 9 is designated as a second signal path 15.

FIG. 2 shows a second signal path 15a of a first driver circuit and a second signal path 15b of a second driver circuit. The second driver circuit is constructed in a manner corresponding to the first driver circuit. The first signal paths 14 of the first and second driver circuits are not illustrated since they are not important for the signal profiles considered. The data input 1 is connected to the first inverter 2 and, via a first connecting line 16, to a first input of a first NAND gate 12. The output of the first NAND gate 12 is connected via a second connecting line 17 to a third gate terminal 18 of a third transistor 19. The third transistor 19 is constructed as an NMOS field-effect transistor and is connected to ground 10 by an output. An input of the third transistor 19 is connected to a third connecting line 20. The third connecting line 20 is connected to the second gate terminal 11 of the second transistor 9.

The second connecting line 17 is additionally connected to a fourth gate terminal 21 of a fourth transistor 22. The fourth transistor 22 is a PMOS field-effect transistor, an output of the fourth transistor 22 is connected to the third connecting line 20. An input of the fourth transistor 22 is connected to the supply voltage 7.

Furthermore, the second connecting. line 17 is connected to a fifth gate terminal 23 of a fifth transistor 24. Furthermore, the second connecting line 17 is connected via a third inverter 25 to a sixth gate terminal 26 of a sixth transistor 27. The sixth transistor 27 is a PMOS field-effect transistor. An input of the sixth transistor 27 is connected to the supply voltage 7. An output of the sixth transistor 27 is connected to an input of the fifth transistor 24. An output of the fifth transistor 24 is connected to the third connecting line 20. The fifth transistor 24 is a PMOS field-effect transistor.

The second signal path 15b of the second driver circuit has a second data input 28 and a second control input 29. The second data input 28 is connected to a fourth inverter 30 and the second control input 29 is connected to a fifth inverter 31. The fourth and fifth inverters 30, 31 are each connected via an output to a first and second input, respectively, of a second NAND gate 32. The second NAND gate 32 is connected via an output to a fourth connecting line 33. The fourth connecting line 33 is connected to a seventh gate terminal 34 of a seventh transistor 35. An input of the seventh transistor 35 is connected to a fifth connecting line 42. An output of the seventh transistor 35 is connected to ground 10. Furthermore, the third connecting line 33 is connected to an eighth gate terminal 36 of an eighth transistor 37, to a ninth gate terminal 38 of a ninth transistor 39, to a second input of a third NAND gate 40 and to an input of a sixth inverter 41.

The seventh transistor 35 is an NMOS field-effect transistor. The eighth and ninth transistors 37, 39 are PMOS field-effect transistors. The eighth transistor 37 is connected to the supply voltage 7 by an input and to the fifth connecting line 42 by an output. The fifth connecting line 42 is connected to a tenth gate terminal 43 of a tenth transistor 44. The tenth transistor 44 is an NMOS field-effect transistor, the input of the tenth transistor 44 is connected to a second data output 45. The output of the tenth transistor 44 is connected to ground 10.

The first connecting line 16 is connected via a branch connection 83 to a first input of a fourth NAND gate 46. An output of the sixth inverter 41 is connected to a second input of the fourth NAND gate 46. An output of the fourth NAND gate 46 is connected to an eleventh gate terminal 47 of an eleventh transistor 48. The eleventh transistor 48 is a PMOS field-effect transistor. An input of the eleventh transistor 48 is connected to the supply voltage 7 and an output of the eleventh transistor 48 is connected to the fifth connecting line 42.

The data input 1 is connected via a sixth connecting line 49 to a first input of the third NAND gate 40. An output of the third NAND gate 40 is connected to a twelfth gate terminal 50 of a twelfth transistor 51. The twelfth transistor 51 is a PMOS field-effect transistor and is connected to the supply voltage 7 by an input and to the input of the ninth transistor 39 by an output. The ninth transistor 39 is connected to the fifth connecting line 42 by an output.

What is achieved by the coupling of the second signal paths 15a, 15b of the first and second driver circuits is that, in the event of a simultaneous change in the signal amplitude at the data input 1 and at the second data input 28, the gate voltages at the second gate terminal 11 and at the tenth gate terminal 43 are changed virtually simultaneously, but the voltages at the second gate terminal 11 and the tenth gate terminal 43 are altered with different temporal gradients. The circuits are preferably configured in such a way that the gate voltages at the second gate terminal 11 and at the tenth gate terminal 43 simultaneously reach the low or high level. The circuit affords advantages particularly when the signal level at the data input 1 and at the second data input 28 simultaneously changes from a high state to a low state. On account of the circuit characteristic, the second and tenth transistors 9, 44, too, are not switched simultaneously with maximum temporal gradients of the gate voltages, with the result that the ground potential 10 is not loaded with excessively large currents and raised.

The method of operation of the circuit configuration of FIG. 2 is explained in more detail below with reference to FIG. 3. FIG. 3 shows signal profiles of a first input signal D(0), which is present at the data input 1, and of a second input signal D(1), which is present at the second data input 28. The first gate voltage CN(0) and the second gate voltage CN(1) are illustrated in temporal synchronism with the signals, which voltages are present at the second gate terminal 11 and at the tenth gate terminal 43, respectively. The first gate voltage CN(0) is illustrated by broken lines in FIG. 3. If a low level is present at the second and, respectively, tenth gate terminal 11, 43, then the second transistor 9 and the tenth transistor 44 are turned off. If a high level is present at the second and, respectively, tenth gate terminal 11, 43, then the second transistor 9 and the tenth transistor 44 are turned on, with the result that the first signal output 8 and the second signal output 45 are switched to ground potential, i.e. to a low level. The signal profiles are plotted against time t.

At the instant T0, both the first input signal D(0) and the second input signal D(1) each have a high level. At this instant, both the first gate voltage CN(0) and the second gate voltage CN(1) have a low level. As a result, the second transistor 9 and the tenth transistor 44 are turned off.

It can be gathered from FIG. 1 that, in the event of a high level at the data input 1, a low level is present at the first gate terminal 5 of the first transistor 6 and, consequently, the first transistor 6 is activated. As a result, both the first and the second data output 8, 45 are connected to the supply voltage 7 and thus switched to a high level.

In the event of a high level at the data input 1 and a low level at the control input 4, a high level is present at the third gate terminal 18, with the result that the third transistor 19 is turned on. Furthermore, a low level is present at the sixth gate terminal 26 of the sixth transistor 27, with the result that the sixth transistor 27 is turned on. The sixth transistor 27 is connected in series with the fifth transistor 24, which is in turn connected to the second gate terminal 11. However, a high level is present at the fifth gate terminal 23 of the fifth transistor 24, with the result that the fifth transistor 24 is turned off. Furthermore, a high level is present at the fourth gate terminal 21 of the fourth transistor 22, with the result that the fourth transistor 22 is also turned off. Consequently, the second gate terminal 11 is connected to ground 10 only via the third transistor 19. Consequently, the second transistor 9 is turned off.

In the second signal path 15b, the following circuit state is present at the instant T0. In the event of a low level at the second control input 29 and a high level at the second data input 28, there is a high level on the fourth connecting line 33. Consequently, the seventh transistor 35 is turned on and connects the tenth gate terminal 43 to ground 10. A high level is present in each case at the eighth gate terminal 36 and at the ninth gate terminal 38 of the eighth transistor 37 and of the ninth transistor 39, respectively, with the result that the eighth and ninth transistors 37, 39 are turned off. A low level is present in each case at the two inputs of the fourth NAND gate 46, with the result that a high level is present at the eleventh gate terminal 47. The eleventh transistor 48 is thus turned off. A high level is present in each case at the inputs of the third NAND gate 40, with the result that a low level is output at the output of the third NAND gate 40, and the twelfth transistor 51 is thus turned on. The twelfth transistor 51 is connected to the fifth connecting line 42 via the ninth transistor 39. The ninth transistor 39 is turned off, however, with the result that the fifth connecting line 42 is not connected to the supply voltage 7. If the first and second input signals D(0), D(1) then change simultaneously from a high level to a low level at the instant T1, then the below listed changeover operations are initiated.

In the first signal path 15a, the change in the first input signal to a low level causes the third transistor 19 to be turned off and the fourth and fifth transistors 22, 24 to be immediately turned on. Since the sixth transistor 27 is also still turned on, the second gate terminal 11 is connected to the supply voltage 7 via a first current path via the fourth transistor 22 and via a second current path via the fifth and sixth transistors 24, 27. Consequently, the voltage at the second gate terminal 11 rises with a large temporal gradient. At an instant T2, the altered signal level on the second connecting line 17 also passes via the third inverter 25 to the sixth gate terminal 26. A high level is thus present at the sixth gate terminal 26 at the instant T2, with the result that the sixth transistor 27 is then turned off. Consequently, after the instant T2, the second gate terminal 11 is charged only via the fourth transistor 22. The voltage continues to rise at the second gate terminal 11, but the temporal gradient of the voltage is smaller than between the instants T1 and T2. The first gate voltage CN(0) reaches a maximum voltage value at an instant T5. We will now consider the second signal path 15b of the second driver circuit starting from the instant T0. At the instant T0, an input signal with a high state is present both at the data input 1 and at the second data input 28. A control signal with a low state is applied in each case to the control input 4 and to the second control input 29. Consequently, a high level is switched on the fourth connecting line 33, and turns the seventh transistor 35 on. The eighth transistor 37 and the ninth transistor 39 are turned off. A low level is present at the output of the third NAND gate 40, with the result that the twelfth transistor 51 is turned on. Two low levels are present at the inputs of the fourth NAND gate 46, with the result that a high level is present at the output of the fourth NAND gate 46. The eleventh transistor 48 is thus turned off. Consequently, at the instant T0, the tenth gate terminal 43 is connected to ground 10 only via the seventh transistor 35 and is thus switched to a low level. Consequently, the tenth transistor 44 is also turned off. It can be seen from FIG. 1 that the second data output 45 is switched to a high level in this state via the first signal path of the second driver circuit, which is not illustrated in FIG. 2, given the input signals and control signals present.

If the first and second input signals then change simultaneously at the data input 1 and at the second data input 28 from the high level to a low level at the instant T1, then switching operations are initiated.

The changeover of the input signal at the second control input 28 to a low level effects a changeover of the voltage state on the fourth connecting line 33, which is changed over to a low level. Consequently, the seventh transistor 35 is immediately turned off. At the same time, the eighth transistor 37 and the ninth transistor 39 are turned on. At this instant, the gate terminal of the twelfth transistor 51 is switched to high level by the first input signal D(0) via the third NAND gate, with the result that the twelfth transistor 51 is in an off state and the tenth gate terminal 43 is connected to the supply voltage 7 only via a first current path via the eighth transistor 37. Consequently, after the instant T2, the second gate voltage CN(1) rises moderately after the instant t1.

On account of signal propagation times through the sixth inverter 41 and the fourth NAND gate 46, the eleventh transistor 48 is not turned on until at the instant T4, with the result that the tenth gate terminal 43 is then connected to the supply voltage 7 via the first current path and via a third current path via the eleventh transistor 48. Since two current paths are then closed, the second gate voltage CN(1) rises after the instant T4 with a larger temporal gradient up to the maximum voltage.

After the changeover of the first and second input signals to low level, high levels are present at the inputs of the fourth NAND gate 46, with the result that the output of the fourth NAND gate 46 outputs a low level to the eleventh gate terminal 47. The eleventh transistor 48 is turned on by the low level.

The high level at the tenth gate terminal 43 turns the tenth transistor 44 on, with the result that the second data output 45 is put at the ground potential and, consequently, has a low level.

On account of the third signal path, the temporal gradient of the second gate voltage CN(1) is altered. In this way, both the first and the second gate voltage CN(0), CN(1) can be simultaneously exposed to an altered voltage at the instant T1, the voltage rise between the first and second gate voltages having different magnitudes. The gradients of the first and second gate voltages are preferably set in such a way that the respective maximum gradient of the first and second gate voltages is not present simultaneously. Generation of interference signals is reduced in this way. Interference signals are generated in a manner proportional to the temporal gradient of the current change di/dt. Furthermore, the circuit configuration of FIG. 2 affords the advantage that the temporal gradients of the first and second gate voltages are altered after a predeterminable period of time, with the result that the first and second gate voltages simultaneously reach the maximum voltage value, i.e. a low or high state.

In a simple embodiment, it is also possible for the circuits to be configured in such a way that the temporal gradients of the first and second gate voltages are different throughout the changeover operation between T1 and T5, with the result that the first and second gate voltages reach the maximum voltage value at different instants.

Figure 4:
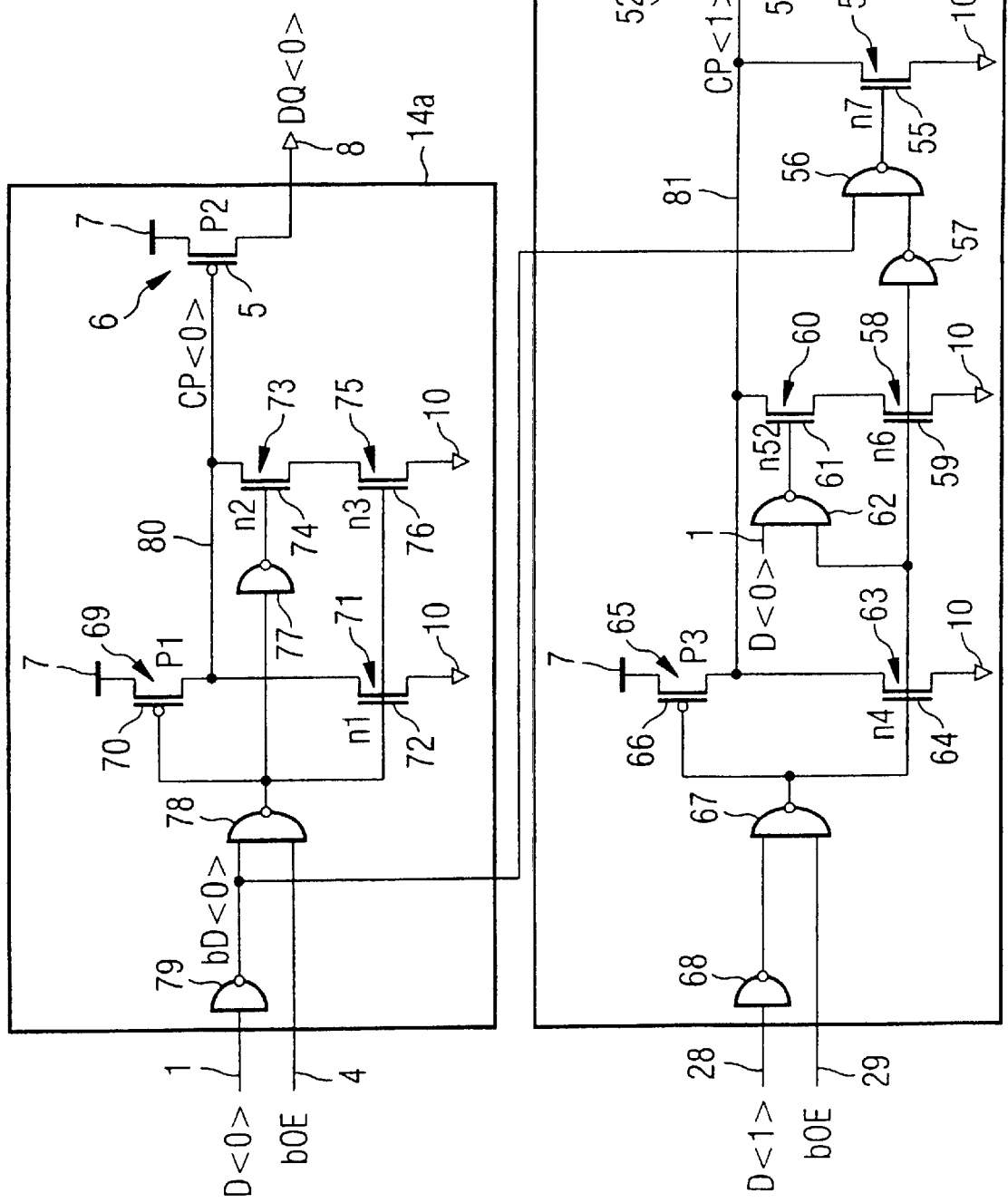
FIG. 4 is a circuit diagram of a second detail of the driver circuit.

FIG. 4 shows two first signal paths 14a, 14b of the first and second driver circuits, which signal paths are disposed next to one another. The first driver circuit is illustrated in FIG. 1 and the second driver circuit is configured analogously to the first driver circuit. As illustrated in FIG. 2 for the second transistor 9, it is likewise advantageous for the first transistor 6 of the first driver circuit and the corresponding first transistor 6 of the second driver circuit if the changeover behaviors of the transistors which produce a connection between the data outputs and the voltage supply 7 are coordinated with one another, in order that the generation of relatively large interference voltages is reduced.

The first signal path 14a is connected to the data input 1 and the control input 4. The first input signal D(0) is fed in via the data input 1. A control signal with a low level is fed in via the control input 4. The data input 1 is connected via an eleventh inverter 79 to an input of a fourth NOR gate 78. A second input of the fourth NOR gate 78 is connected to the control input 4. An output of the fourth NOR gate 78 is connected to a nineteenth gate terminal 70 of a nineteenth transistor 69. The nineteenth transistor 69 is a PMOS transistor whose input is connected to the voltage supply 7. Furthermore, the output of the fourth NOR gate 78 is connected to a twentieth gate terminal 72 of a twentieth transistor 71. The twentieth transistor 71 is a NMOS field-effect transistor. An input of the twentieth transistor 71 is connected to the output of the nineteenth transistor 69, which is additionally connected to a seventh connecting line 80. An output of the twentieth transistor 71 is connected to ground 10. Furthermore, the output of the fourth NOR gate 78 is connected to a tenth inverter 77. Moreover, the output of the fourth NOR gate 78 is connected to a twenty-second gate terminal 76 of a twenty-second transistor 75. The twenty-second transistor 75 is an NMOS field-effect transistor. The twenty-second transistor 75 is connected to ground 10 by an output and to an output of a twenty-first transistor 73 by an input. The input of the twenty-first transistor 73 is connected to the seventh connecting line 80. An output of the tenth inverter 77 is connected to a twenty-first gate terminal 74 of the twenty-first transistor 73. The twenty-first transistor 73 is an NMOS field-effect transistor. The seventh connecting line 80 is connected to the first gate terminal 5 of the first transistor 6. An input of the first transistor 6 is connected to the voltage supply 7 and an output of the first transistor 6 is connected to the first signal output 8. Also connected to the first signal output 8, in accordance with FIG. 2, is the second transistor 9, but the latter is not illustrated in FIG. 4.

The first signal path 14b of the second driver circuit is connected to the second data input 28 and to the second control input 29. The second data input 28 is connected to a ninth inverter 68, whose output is connected to an input of a third NOR gate 67. A second input of the third NOR gate 67 is connected to the second control input 29. The output of the third NOR gate 67 is connected to an eighteenth gate terminal 66 of an eighteenth transistor 65 and to a seventeenth gate terminal 64 of a seventeenth transistor 63. The eighteenth transistor 65 is a PMOS field-effect transistor whose input terminal is connected to the supply voltage 7. The seventeenth transistor 63 is an NMOS field-effect transistor, the input of the seventeenth transistor 63 being connected to the output of the eighteenth transistor 65. The output of the seventeenth transistor 63 is connected to ground 10. The output of the eighteenth transistor 65 is additionally connected to an eighth connecting line 81. The eighth connecting line 81 is connected to a thirteenth gate terminal 53 of a thirteenth transistor 52. The thirteenth transistor 52 is a PMOS field-effect transistor. The output of the thirteenth transistor 52 is connected to the second data output 45. The second data output 4S is likewise connected to the tenth transistor 44, but the latter is not illustrated in FIG. 4.

The output of the third NOR gate 67 is furthermore connected to a second input of a second NOR gate 62, a fifteenth gate terminal 59 of a fifteenth transistor 58 and an eighth inverter 57. A first input of the second NOR gate 62 is connected to the data input 1. The output of the second NOR gate 62 is connected to a sixteenth gate terminal 61 of a sixteenth transistor 60. The sixteenth transistor 60 and the fifteenth transistor 58 are in each case NMOS field-effect transistors. The input of the sixteenth transistor 60 is connected to the eighth connecting line 81 and the output of the sixteenth transistor 60 is connected to the input of the fifteenth transistor 58. The output of the fifteenth transistor 58 is connected to ground 10.

An output of the eighth inverter 57 is connected to a second input of a first NOR gate 56. A second input of the first NOR gate 56 is connected to the output of the eleventh inverter 79. An output of the first NOR gate 56 is connected to a fourteenth gate terminal 55 of a fourteenth transistor 54. The fourteenth transistor 54 is an NMOS field-effect transistor. An input of the fourteenth transistor 54 is connected to the eighth connecting line 81 and an output of the fourteenth transistor 54 is connected to ground 10. The method of operation of the circuit configuration of FIG. 4 is explained in more detail below with reference to the signal profiles of FIG. 5.

Figure 5:
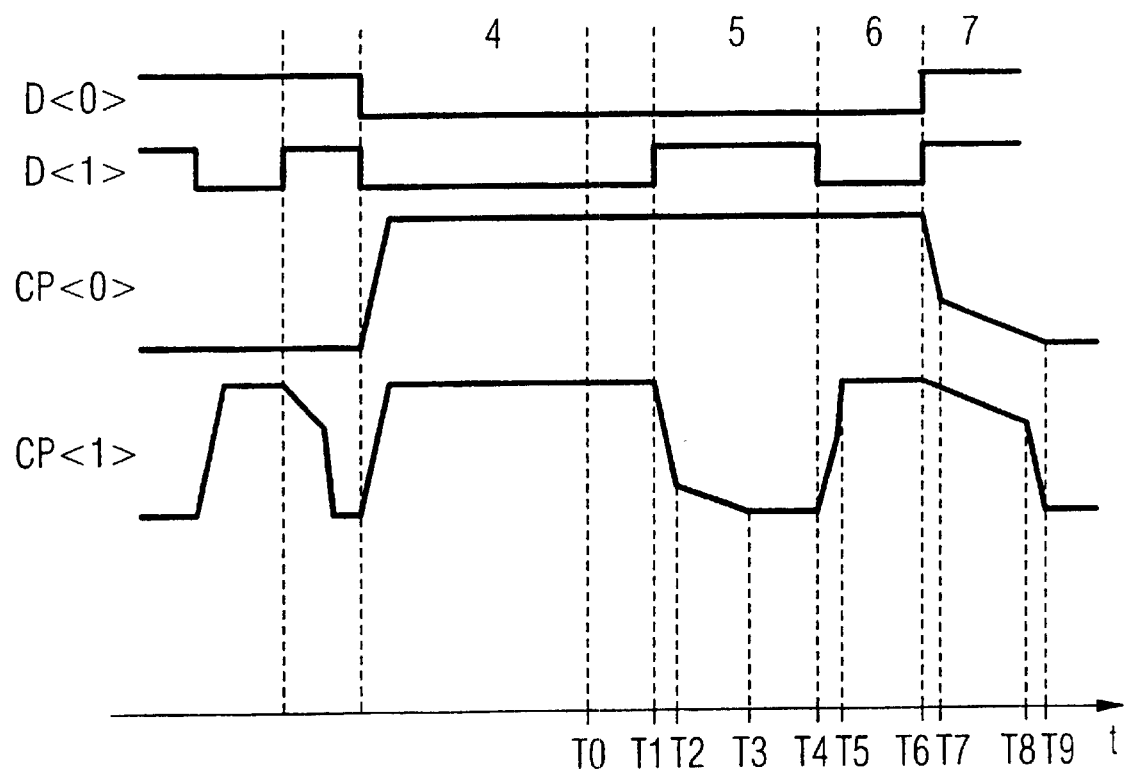
FIG. 5 is a second signal-timing diagram.

FIG. 5 shows a temporal signal profile of the first input signal D(0), of the second input signal D(1), of a third gate voltage CP(0), which is present at the first gate terminal 5, and the temporal signal profile of a fourth gate voltage CP(1), which is present at the thirteenth gate terminal 53.

It is assumed below that the control signal at the control input 4 and at the second control input 29 has a low level. An essential function of the circuit configuration illustrated in FIG. 4 relates to the fact that, in the event of a simultaneous change in the first and second input signals D(0), D(1) from a low level to a high level, the corresponding change of the output signals at the signal output 8 and at the signal output 45 are coordinated with one another, with the result that the smallest possible interference voltage is generated, in particular in the supply voltage and at the ground potential.

At the instant T0, a low potential is present in each case at the data input 1 and at the second data input 28, with the result that the third and fourth gate voltages CP(0), CP(1) at the first transistor 6 and at the thirteenth transistor 52 each have a high signal and the first and thirteenth transistors 6, 52 are thus turned off. Consequently, the first and second signal outputs 8, 45 are at low potential via the circuit configuration of FIG. 2, i.e. via the second and tenth transistors 9, 44.

At the instant T1, the second input signal at the second data input 28 is altered to a high level. Consequently, a low level is present at the output of the ninth inverter 68. Consequently, a high level is then present at the output of the third NOR gate 67, with the result that the eighteenth transistor 65 is switched from an on state to an off state. Consequently, the connection between the voltage supply 7 and the thirteenth gate terminal 53 of the thirteenth transistor 52 is interrupted. At the same time, the seventeenth transistor 63 is turned on by the high level at the output of the third NOR gate 67, with the result that the thirteenth gate terminal 53 is connected to ground 10 via the seventeenth transistor 63. Furthermore, the fifteenth transistor 58 is turned on by the high potential at the output of the third NOR gate 67. A high potential is likewise present at the second input of the second NOR gate 62 and a low potential of the data input 1 is passed to the first input of the second NOR gate 62. At this instant, the sixteenth transistor 60 is still turned on, with the result that the thirteenth gate terminal 13 is connected to ground 10 via a second current path via the sixteenth transistor 60 and the fifteenth transistor 58. Consequently, the fourth gate voltage CP(1) changes with a large temporal gradient until, at the instant T2, the output of the second NOR gate 62 is changed over to low potential and, consequently, the sixteenth transistor 60 is turned off. After the instant T2, the fourth gate voltage CP(1) is connected to ground 10 only via the seventeenth transistor 63, with the result that the temporal gradient of the voltage flattens until, at the instant T3, a low potential is present at the thirteenth gate terminal 53. When a low potential is applied to the thirteenth gate terminal 53, the thirteenth transistor 52 is fully activated, with the result that the second signal output 45 is connected to the high potential of the voltage supply 7.

If, at the instant T4, the input signal at the second data input 28 is then switched to a low potential again, the eighteenth transistor 65 is turned on again and, at the same time, the seventeenth transistor 63 and the fifteenth transistor 58 are turned off. Consequently, the potential at the thirteenth gate terminal 53 is raised again to the potential of the voltage supply 7 via the eighteenth transistor 65.

The fourteenth transistor 54 remains turned off during the switching operations since a high potential is in case present at the first input of the first NOR gate 56 via the output of the eleventh inverter 79.

In the event of a low potential at the data input 1, a high potential is present at the output of the eleventh inverter 79 and a low potential is thus present at the output of the fourth NOR gate 78. The control input 4 is always set to low potential. Consequently, the nineteenth transistor 69 is turned on and the twentieth transistor 71 is turned off. The twenty-second transistor 75 is also switched into an off state. Consequently, the first gate terminal 5 is connected to the voltage supply 7 via the nineteenth transistor 69 and thus has a high potential. The twenty-second transistor 75 is also switched into an off state in the event of a high potential at the data input 1.

If the input signal both of the first and of the second data input 1, 28 is then subsequently switched to a high level at the instant T6, the below listed circuit operations are initiated.

At the instant T6, both the data input 1 and the second data input 28 are changed over to a high potential. Consequently, a high potential is present at the output of the fourth NOR gate 78, with the result that the nineteenth transistor 69 is immediately closed and the twentieth transistor 71 and the twenty-second transistor 75 are immediately opened. In this state, the twenty-first transistor 73 is also turned on. At the instant T7, the altered output signal of the fourth NOR gate 78 also reaches the twenty-first gate terminal 74 of the twenty-first transistor 73 via the tenth inverter 77. Consequently, the twenty-first transistor 73 is turned off at the instant T7.

In the time period between T6 and T7, the third gate voltage CP(0) is connected to the ground potential 10 via a first and a second current path. The first current path is represented by the twentieth transistor 71 and the second current path is represented by the series circuit formed by the twenty-first transistor 73 and the twenty-second transistor 75. Consequently, the third gate voltage CP(0) falls with a large temporal gradient. At the instant T7, the second current path is turned off via the twenty-first transistor 73, with the result that the third gate potential is connected to ground potential only via the first current path and the temporal gradient thus becomes smaller. At an instant T9, the third gate potential reaches the low state prescribed by the ground potential.

The temporal change of the fourth gate potential CP(1) changes after the instant T6 since the seventeenth transistor 63 is turned on by the change of the input signal at the second data input 28 to a high level. At the same time, the eighteenth transistor 65 is switched into an off state. Consequently, the fourth gate voltage falls with a first temporal gradient. The sixteenth transistor 60 is switched into an off state by the first input signal D(0) via the second NOR gate 62. On account of signal propagation times via the eighth inverter 57 and the first NOR gate 5, the fourteenth transistor 54 is turned on at the instant T8. Consequently, starting from the instant T8, the thirteenth gate terminal 53 is connected to ground potential 10 both via a first current path via the seventeenth transistor 63 and via a second current path via the fourteenth transistor 54. Consequently, the temporal gradient of the fourth gate voltage rises, with the result that the fourth gate voltage falls more rapidly to the low level at the instant T9.

It can clearly be discerned from FIG. 5 that maximum values of the temporal gradient of the third and fourth gate voltages do not occur simultaneously, with the result that the generation of an interference voltage is reduced. After the third and fourth gate voltages have reached the low potential at the instant T9, the first transistor 6 and the thirteenth transistor 52 are turned on, with the result that both the signal output 8 and the second signal output 45 are switched to a high potential in accordance with the supply voltage 7.

The propagation times and the delay times through the inverter and the NOR gates are coordinated with one another between the first signal path 14a of the first driver circuit and the first signal path 14b of the second driver circuit in such a way that the third and fourth gate voltages CP(0), CP(1) simultaneously reach the low potential at the instant T9.

In a preferred embodiment, two driver circuits disposed next to one another have both the signal paths of FIG. 2 and the signal paths of FIG. 4. What is achieved in this way is that, both in the event of simultaneous changeover of the input signals at the data input 1 and at the second data input 29 from a low potential to a high potential and in the event of simultaneous changeover from a high potential to a low potential, although the gate potential at the first transistor 6 and at the thirteenth transistor 52 are changed simultaneously, the temporal gradients have different magnitudes. Preferably, the gate voltages at the first transistor 6 and at the thirteenth transistor 52 reach the low potential simultaneously. The switching operation is precisely defined as a result.

Equally, the gate potentials at the second transistor 9 and at the tenth transistor 44 are changed simultaneously, but the temporal gradients of the change of the gate voltages at the second gate terminal 11 and at the tenth gate terminal 43 are chosen such that they have different magnitudes. Through appropriate coordination, the first and second gate voltages reach the predetermined high potential at the same instant T5. The output signals at the first and second data outputs 8, 45 behave analogously to the first, second, third and fourth gate voltages. Consequently, maximum voltage gradients are not present simultaneously at the first and second data outputs either.

The sixth inverter 41 and the fourth NAND gate 46 are provided as a first delay circuit in FIG. 2, and they bring about delayed forwarding of a changed input signal to the eleventh transistor 48 relative to forwarding of the changed input signal via the third transistor 19.

The third inverter 25 is provided as a second delay circuit, and it brings about delayed forwarding—relative to the fifth transistor 24—of a changed first input signal to the sixth transistor 27.

The third NAND gate 40 is provided as a third delay circuit, and it brings about delayed forwarding of a changed input signal to the twelfth transistor 51 relative to the ninth transistor 39.

The tenth inverter 77 is provided as a fourth delay circuit in FIG. 4, and this brings about delayed forwarding—relative to the twenty-second transistor 75—of a changed first input signal to the twenty-first transistor 73.

The second NOR gate 62 is provided as a fifth delay circuit, and it brings about delayed forwarding—relative to the fifteenth transistor 58—of a changed second input signal to the sixteenth transistor 60.

The series circuit containing the first NOR gate 56 and the eighth inverter 57 is provided as sixth delay circuit, and it brings about delayed forwarding—relative to the seventeenth transistor 63—of a changed second input signal to the fourteenth transistor 54.

I claim:

1. A method for a parallel amplification of two input signals including a first input signal and a second input signal, a first amplified output signal being formed from the first input signal and a second amplified output signal being formed from the second input signal, which comprises the steps of:
    performing the following steps in an event of a change in amplitudes of the two input signals in a predetermined time period:
        changing the first amplified output signal with a first temporal gradient during a first time period;
        changing the first amplified output signal with a second temporal gradient during a second time period, the first temporal gradient being larger than the second temporal gradient;
        changing the second amplified output signal with a third temporal gradient during a third time period; and
        changing the second amplified output signal with a fourth temporal gradient during a fourth time period, the fourth temporal gradient being larger than the third temporal gradient.

2. The method according to claim 1, which comprises starting the changing of the first and second amplified output signals simultaneously.

3. The method according to claim 1, which comprises performing only one of the first temporal gradient and the fourth temporal gradient at any given time.

4. The method according to claim 1, which comprises changing the first and second amplified output signals such that the first and second amplified output signals simultaneously reach a maximum high level or a minimum low level, respectively.

5. The method according to claim 1, which comprises forming the two input signals and the first and second amplified output signals to be digital signals that change between two amplitudes.

6. The method according to claim 1, which comprises using signals read from memory cells of a memory as the two input signals.

7. The method according to claim 1, which comprises:
    setting the first temporal gradient to be substantially equivalent to the fourth temporal gradient; and
    setting the second temporal gradient to be substantially equivalent to the third temporal gradient.

8. A circuit configuration, comprising:
    two driver circuits, including a first driver circuit and a second driver circuit, for a parallel read-out of signals, each of said two driver circuits having an input for receiving one of two input signals and an output; and
    an adapting circuit connected to said input of each of said two driver circuits, and in that, in an event of a change of amplitudes of the two input signals in a predetermined time period, said adapting circuit changes a first output signal with a first temporal gradient in a first time period and then changes the first output signal with a second temporal gradient being smaller than the first temporal gradient in a second time period, said adapting circuit changes a second output signal with a third temporal gradient in a third time period and then changes the second output signal with a fourth temporal gradient in a fourth time period, the fourth temporal gradient being larger than the third temporal gradient.

9. The circuit configuration according to claim 8, wherein said first driver circuit has a first output circuit and said second driver circuit has a second output circuit.

10. The circuit configuration according to claim 9, wherein said first output circuit includes a connecting line, a first output transistor having a gate terminal, and a second output transistor having a gate terminal, said first and second output transistors are connected in series through said connecting line, said connecting line is connected to said output of said first driver circuit, and said gate terminal of at least one of said first and second output transistors is connected to said adapting circuit.

11. The circuit configuration according to claim 9, wherein said second output circuit has a connecting line, a first output transistor with a gate terminal, and a second output transistor with a gate terminal, said first and second output transistors are connected in series through said connecting line, said connecting line connected to said output of said second driver circuit, said gate terminal of at least one of said first and second output transistors is connected to said adapting circuit.

12. The circuit configuration according to claim 11, wherein said adapting circuit connects said gate terminal of at least one of said first output transistor and said second output transistor to a predetermined potential via two paths;

a delay circuit; and including two switches with one of said switches disposed in each of said two paths, said two switches connected to said input of said first and second driver circuits through said delay circuit, said delay circuit connected to said two switches and said delay circuit opens or closes said two switches in an event of a change of a state of the two input signals in the predetermined time period, including in an event of a simultaneous change, at different instants.

13. The circuit configuration according to claim 12, wherein said delay circuit has a gate.

14. The circuit configuration according to claim 12, wherein said two switches are field-effect transistors.

15. The circuit configuration according to claim 11, wherein said first output transistor is a NMOS transistor having an input and said second output transistor is an PMOS field-effect transistor, said input of said PMOS transistor is to be connected to a high voltage potential and said input of said NMOS field-effect transistor is to be connected to a low voltage potential.

16. The circuit configuration according to claim 10, wherein said first output transistor is a PMOS transistor having an input and said second output transistor is an NMOS field-effect transistor, said input of said PMOS transistor is to be connected to a high voltage potential and said input of said NMOS field-effect transistor is to be connected to a low voltage potential.

17. The circuit configuration according to claim 10, wherein said adapting circuit connects said gate terminal of at least one of said first output transistor and said second output transistor to a predetermined potential via two paths;

including a delay circuit; and including two switches with one of said switches disposed in each of said two paths, said two switches are coupled to said input of said first driver circuit through said delay circuit, said delay circuit connected to said two switches and opens or closes said two switches in an event of a change of a state of the two input signals in the predetermined time period, including in an event of a simultaneous change, at different instants.

18. The circuit configuration according to claim 17, wherein said delay circuit has a gate.

19. The circuit configuration according to claim 17, wherein said two switches are field-effect transistors.

* * * * *